(12) United States Patent
Carlson

(10) Patent No.: US 12,316,332 B2
(45) Date of Patent: May 27, 2025

(54) DIGITAL CLEAN UP OSCILLATOR

(71) Applicant: NATIONAL RESEARCH COUNCIL OF CANADA, Ottawa (CA)

(72) Inventor: Brent Carlson, Penticton (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 0 days.

(21) Appl. No.: 18/287,746

(22) PCT Filed: Apr. 26, 2022

(86) PCT No.: PCT/IB2022/053867
§ 371 (c)(1),
(2) Date: Oct. 20, 2023

(87) PCT Pub. No.: WO2022/229844
PCT Pub. Date: Nov. 3, 2022

(65) Prior Publication Data
US 2024/0187004 A1    Jun. 6, 2024

Related U.S. Application Data

(60) Provisional application No. 63/188,139, filed on May 13, 2021, provisional application No. 63/180,703, filed on Apr. 28, 2021.

(51) Int. Cl.
*H03L 7/093* (2006.01)
*H03L 7/14* (2006.01)

(52) U.S. Cl.
CPC .............. *H03L 7/093* (2013.01); *H03L 7/145* (2013.01)

(58) Field of Classification Search
CPC .......... H03L 7/085; H03D 13/00; H03D 7/00; H03D 7/16; H03K 3/013; H03K 5/1252
See application file for complete search history.

(56) References Cited

U.S. PATENT DOCUMENTS

| | | | |
|---|---|---|---|
| 3,751,900 A | 8/1973 | Phillips et al. | |
| 4,551,856 A | 11/1985 | Victor et al. | |
| (Continued) | | | |

OTHER PUBLICATIONS

PCT/IB2022/053865, System and Method for Remote Digital Time Transfer, Apr. 26, 2022.

(Continued)

*Primary Examiner* — Diana J. Cheng
(74) *Attorney, Agent, or Firm* — Perry + Currier Inc.

(57) ABSTRACT

A digital clean-up oscillator and associated method are provided for cleaning jitter from a noisy clock signal, comprising receiving a reference clock oscillator signal and the noisy clock signal to be cleaned: measuring the frequency of the reference clock signal in the time domain of the noisy clock signal: filtering any frequency variations from the measured frequency of the reference clock signal on timescales shorter than a phase change interval Tau_clean over which jitter in the noisy clock signal is to be cleaned; generating a phase increment signal DDS_pinc based on the measured and filtered frequency of the reference clock signal: clocking the phase increment signal DDS_pinc with the reference clock signal for generating an output digital phase ramp signal φ_DDS(t) that tracks the frequency of the noisy clock signal with phase wander removed on timescales less than the phase change interval Tau_clean; and converting the output digital phase ramp signal φ_DDS(t) to an output jitter-cleaned time domain clock signal frequency locked to the noisy clock signal.

13 Claims, 4 Drawing Sheets

(56) References Cited

U.S. PATENT DOCUMENTS

| | | | |
|---|---|---|---|
| 4,669,051 A | 5/1987 | Barr, IV | |
| 5,673,133 A | 9/1997 | Imaoka et al. | |
| 7,557,661 B1 * | 7/2009 | Melanson | H03L 7/07 |
| | | | 375/376 |
| 7,746,972 B1 | 6/2010 | Melanson et al. | |
| 9,860,054 B1 | 1/2018 | Bradley | |
| 10,868,550 B2 | 12/2020 | Janardhanan et al. | |
| 2002/0130725 A1 | 9/2002 | Han | |
| 2006/0056560 A1 | 3/2006 | Aweya et al. | |
| 2016/0352505 A1 | 12/2016 | Huang | |

OTHER PUBLICATIONS

U.S. Appl. No. 18/287,733, filed Oct. 20, 2023, System and Method for Remote Digital Time Transfer.
PCT/IB2022/053867, Digital Clean Up Oscillator, Apr. 26, 2022.
Carlson, B. R. "Incoherent clocking in coherent radio interferometers." Electronics Letters 54.14 (2018): 909-911.
Levine, Judah. "An algorithm for synchronizing a clock when the data are received over a network with an unstable delay." IEEE transactions on ultrasonics, ferroelectrics, and frequency control 63.4 (2015): 561-570.

* cited by examiner

DIGITAL CLEAN UP OSCILLATOR

FIELD OF THE INVENTION

The present disclosure generally relates to electronic communication methods and systems. More particularly, examples of the disclosure relate to digital clean up oscillators for removing low frequency phase noise from a clock signal and methods of operation thereof.

BACKGROUND OF THE DISCLOSURE

Modern electronic equipment, such as radio interferometer arrays, require precision frequency clock signals with low phase noise, which is typically expressed in terms of noise power relative to the oscillator frequency contained in a 1 Hz bandwidth centered at a certain offset from the oscillator frequency.

Frequency accuracy and precision can derive for example from atomic clocks, however frequency accuracy and precision does not necessarily accompany low phase noise, particlarly where clock signals are distributed over long distances through noisy environments.

Conventional clean-up oscillators (sometimes referred to as "Jitter cleaners") are known for maintaining accuracy, precision and long-term stability of a precision frequency source, while significantly improving the phase noise of the signal, but are subject to a fundamental 1/f noise-related problem in "cleaning" (removing) the phase noise. The basis for such clean-up oscillators is a high performance (low or ultra-low phase noise) quartz crystal oscillator, in particular a high-Q OCXO (oven-controlled crystal oscillator), having a voltage control input that is locked to an accurate (but noisy) input signal via a phase-locked loop (PLL). The OCXO is steered with a control voltage in the PLL loop. However, as the input phase jitter/wander to be filtered drops in frequency, the natural Q of the OCXO limits low-frequency phase wander filtering to about 1 Hz.

Accordingly, a problem exists with respect to removing low frequency phase noise (i.e. jitter/wander) from a precision clock signal.

Any discussion of problems provided in this section has been included in this disclosure solely for the purposes of providing a background for the present invention, and should not be taken as an admission that any or all of the discussion was known at the time the invention was made.

BRIEF DESCRIPTION OF THE DRAWING FIGURES

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements and wherein:

Figure 1:
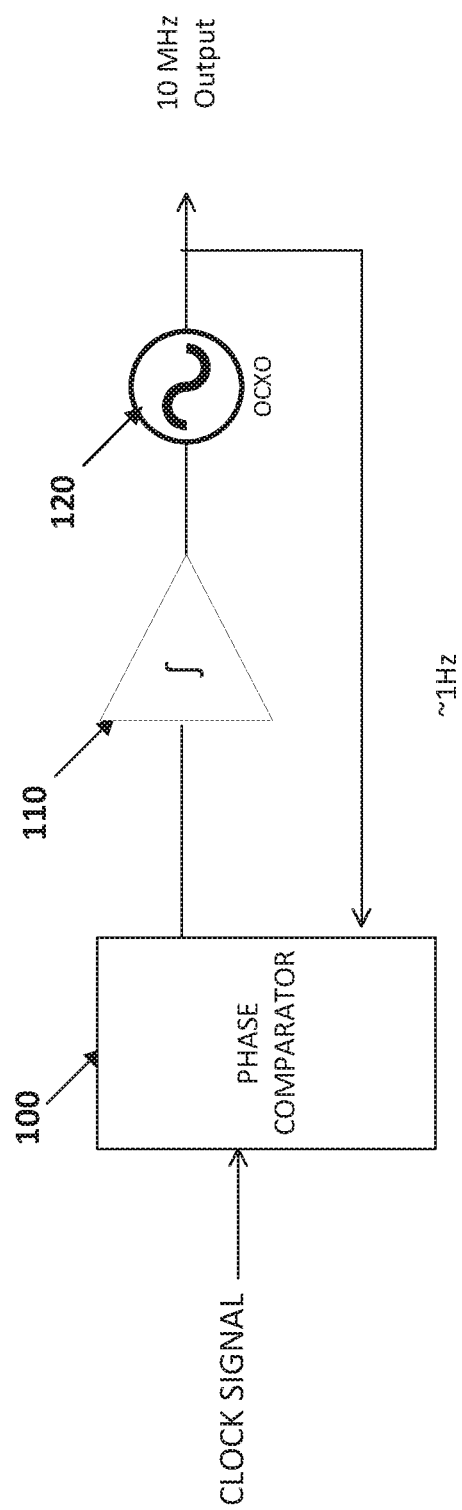
FIG. 1 illustrates a digital clean up oscillator in accordance with the prior art.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure.

DETAILED DESCRIPTION OF EXEMPLARY EMBODIMENTS

The description of exemplary embodiments of the present disclosure provided below is merely exemplary and is intended for purposes of illustration only; the following description is not intended to limit the scope of the invention disclosed herein. Moreover, recitation of multiple embodiments having stated features is not intended to exclude other embodiments having additional features or other embodiments incorporating different combinations of the stated features.

As discussed in greater detail below, a digital clean up oscillator is set forth herein characterized by jitter cleaning timescales longer than currently possible with conventional clean up oscillators that are limited by 1/f noise, and limited only by the frequency stability of a reference frequency, the absolute precise value of which is unimportant.

According to an aspect of this description, there is provided a digital clean-up oscillator, comprising a reference oscillator for generating a high-stability reference clock signal; a precision digital frequency tracker for receiving the reference clock signal and a noisy clock signal to be cleaned, and in response measuring the frequency of the reference clock signal in the time domain of the noisy clock signal; a low pass filter for removing any frequency variations from the measured frequency of the reference clock signal on timescales shorter than a phase change interval over which jitter in the clock signal is to be cleaned; a phase increment calculator for generating a phase increment signal based on the frequency of the reference clock signal measured in the precision digital frequency tracker and filtered by the low pass filter; a direct digital synthesizer for clocking the phase increment signal with the reference clock signal for generating an output digital phase ramp signal that tracks the frequency of the noisy clock signal with phase wander removed on timescales less than the phase change interval; and a digital phase to clock converter for converting the digital phase ramp signal to an output jitter-cleaned time domain clock signal frequency locked to the noisy clock signal.

According to another aspect, there is provided a method of cleaning jitter from a noisy clock signal, comprising receiving a reference clock oscillator signal and the noisy clock signal to be cleaned; measuring the frequency of the reference clock signal in the time domain of the noisy clock signal; filtering any frequency variations from the measured frequency of the reference clock signal on timescales shorter than a phase change interval Tau_clean over which jitter in the noisy clock signal is to be cleaned; generating a phase increment signal DDS_pinc based on the measured and filtered frequency of the reference clock signal; clocking the phase increment signal DDS_pinc with the reference clock signal for generating an output digital phase ramp signal φ_DDS(t) that tracks the frequency of the noisy clock signal with phase wander removed on timescales less than the phase change interval Tau_clean; and converting the output digital phase ramp signal φ_DDS(t) to an output jitter-cleaned time domain clock signal frequency locked to the noisy clock signal.

According to a further aspect, a digital clean-up oscillator is provided, comprising a high stability reference oscillator for generating a high-stability reference clock signal; a first apparatus for receiving the reference clock signal and a noisy clock signal to be cleaned and generating a phase increment signal based on the reference clock signal and the noisy clock signal to be cleaned; and a second apparatus employing the phase increment signal and the reference clock signal for tracking the frequency of the noisy clock signal with phase wander removed on timescales less than the phase change interval to generate an output jitter-cleaned time.

Turning to FIG. 1, a prior art phase-locked 10 MHz clean up oscillator is shown having a phase comparator 100 whose output is filtered (integrated) by a loop filter 110 and applied to a voltage control input of a high-Q OCXO 120. The input to phase comparator 100 is a 10 MHz (or 5 MHz) reference clock signal that is converted to a logical signal and divided. The output frequency of OCXO 120 is also divided down to the same frequency as the divided 10 MHz reference clock signal. Then the reference clock signal and signal output from OCXO 120 are compared in phase comparator 100 and fed via loop filter 110 as an error-signal/control voltage signal for the OCXO 120, thereby forming a PLL loop. However, as the input phase jitter/wander to be filtered drops in frequency, the natural Q of OCXO 120 limits low-frequency phase wander filtering to about 1 Hz.

Figure 2:
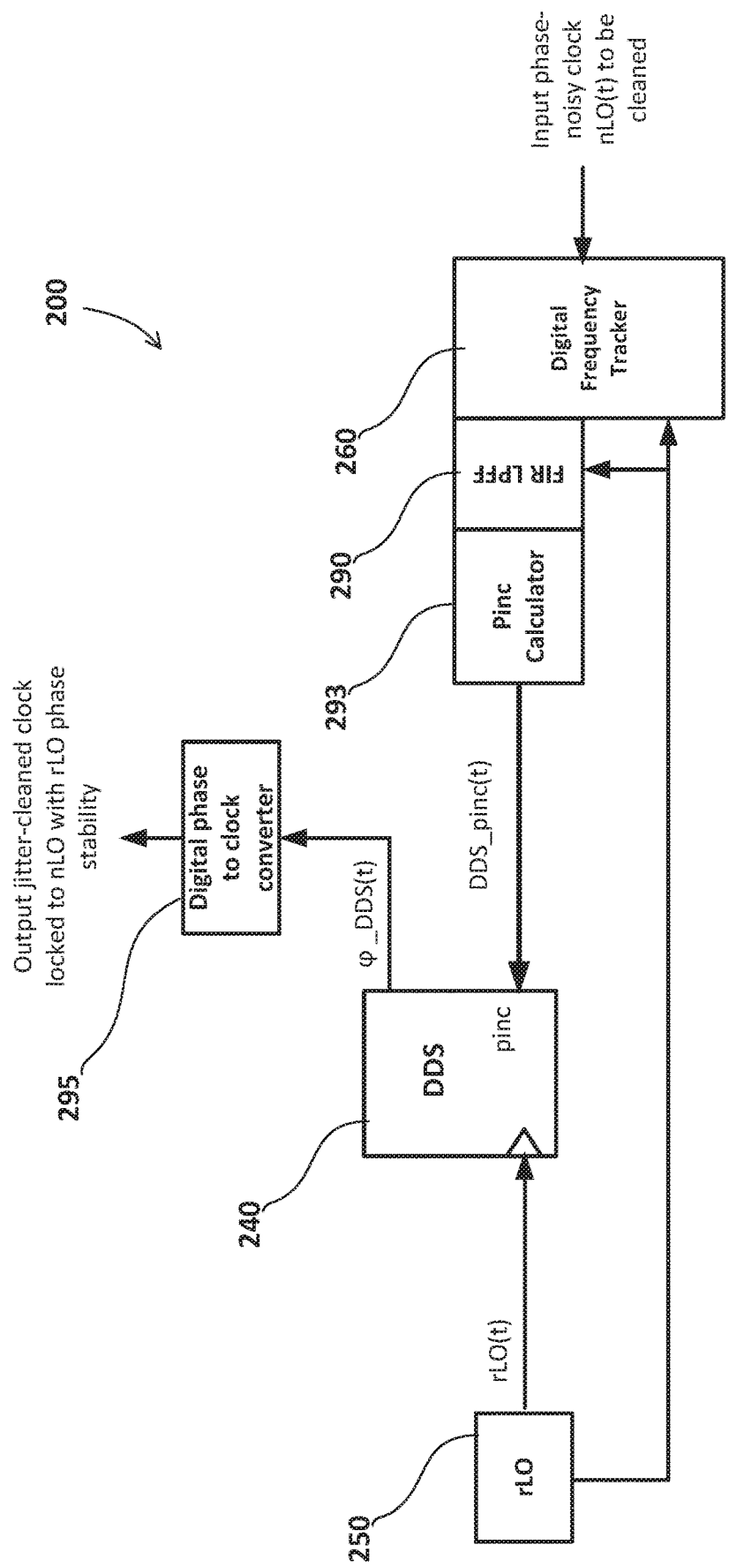
FIG. 2 illustrates a digital clean up oscillator in accordance with an exemplary embodiment.

Turning to FIG. 2, which illustrates an exemplary clean up oscillator 200, a noisy clock to clean, nLO(t), is received at the input of a precision digital frequency tracker (DFT) 260. A second input of DFT 260 receives a high-stability reference clock, rLO(t) from oscillator 250. DFT 260 measures the frequency of the reference clock signal (rLO(t)) in the time domain of the noisy clock signal (nLO(t)). In an embodiment, DFT 260 comprises an all-digital phase/frequency locked loop for adjusting phase and frequency of the reference clock, rLO(t) to lock on to an internally generated clock signal derived from the noisy clock signal nLO(t) to phase and frequency.

The output from DFT 260 is low-pass filtered via an all-digital FIR filter (LPFF 290) to remove any frequency variations on timescales shorter than Tau_clean, where Tau_clean is the phase change interval over which jitter is to be cleaned from nLO(t). Therefore, the cut-off frequency of the LPFF 290 is set at fc=1/(4Tau_clean). Since LPFF 290 is a digital FIR filter, it can have an arbitrarily low cutoff frequency, fc.

Since the delay/integration time, $Tau_{lpf}$, of LPFF 290 is typically ~3/fc for an 80 dB attenuation), any phase wander in rLO(t) on timescales≤$Tau_{lpf}$ may be confused with nLO(t) phase wander. Depending on fc and the magnitude of the jitter/phase wander to be cleaned, finding an rLO 250 with the required stability can be challenging. For example, for Tau_clean=10 seconds (which is ~10× better than known clean up oscillators), fc=0.025 Hz and $Tau_{lpf}$~3/0.025=~120 sec for 80 dB phase jitter/wander attenuation. Generally, since there is no need to steer rLO, it can be any frequency reference with the required stability such as an atomic clock.

In an embodiment, LPFF 290 can be a 2-stage device having a first stage FIR filter for producing filtered data points, P, every $T_{fir}$=10 msec to 1 sec, and a "feed-forward" second stage comprising a 1st or higher order least-squares fit on the previous P points, to produce a closed-form expression that can be evaluated to produce the current filtered frequency measurement. In this case $Tau_{lpf}$=Tau_clean and the unknown phase wander of rLO over $Tau_{lpf}$=P×$T_{fir}$ is the only limiting factor, which results in a jitter cleaning implementation that can use a small-package OCXO reference oscillator for rLO 250. Note that the attenuation of the least-squares fit is limited and is 20 log(sqrt(P)/2) for P statistically independent points with a Gaussian distribution.

Once the filtered frequency measurement is available, it is used by a Pinc calculator 293 to calculate a "pinc" (phase increment) value, DDS_pinc(t), based on the frequency of the reference clock signal (rLO(t)) measured in the precision digital frequency tracker 260 and filtered by the LPFF 290, for application to a direct digital synthesizer (DDS) 240, as discussed below.

Since f_rLO(t), the frequency at which DDS 240 is clocked, is known (i.e. measured) as well as the resolution nb_DDS of DDS 240, (i.e. the number of bits of DDS 240), the phase increment signal DDS_pinc(t) can be solved for a desired $\varphi\_DDS$ (t) and output frequency, f_DDS(t)=d($\varphi\_DDS$ (t))/dt, as follows:

$$f\_DDS = DDS\_\text{pinc}(t)/2^{nb\_DDS} \times f\_rLO(t).$$

where f_rLO(t) is the frequency of rLO(t), measured in the nLO frequency domain by DFT 260 and filtered by LPFF 290, and f_DDS (with phase $\varphi\_DDS(t)$ in FIG. 2) is the output frequency of the signal to be output from DDS 240, which tracks the nLO frequency vs time, with phase wander present in nLO on timescales >Tau_clean but removed for phase wander on timescales <Tau_clean.

The phase increment, DDS_pinc(t), is periodically applied as an input to DDS 240 which clocks the phase increment signal, DDS_pinc, with the reference clock signal, rLO(t), for generating an output digital phase ramp signal, $\varphi\_DDS(t)$, that tracks the frequency of the clock signal (nLO) but with phase wander removed on timescales less than the phase change interval (Tau_clean).

A digital to time domain clock converter 295 then converts the derived digital domain clock signal $\varphi\_DDS(t)$ to a jitter-cleaned ultra-low phase-noise time domain clock signal (i.e. an output jitter-cleaned clock signal locked to the noisy clock signal, nLO(t), with rLO(t) phase noise over Tau_clean uncertainty).

Figure 3:
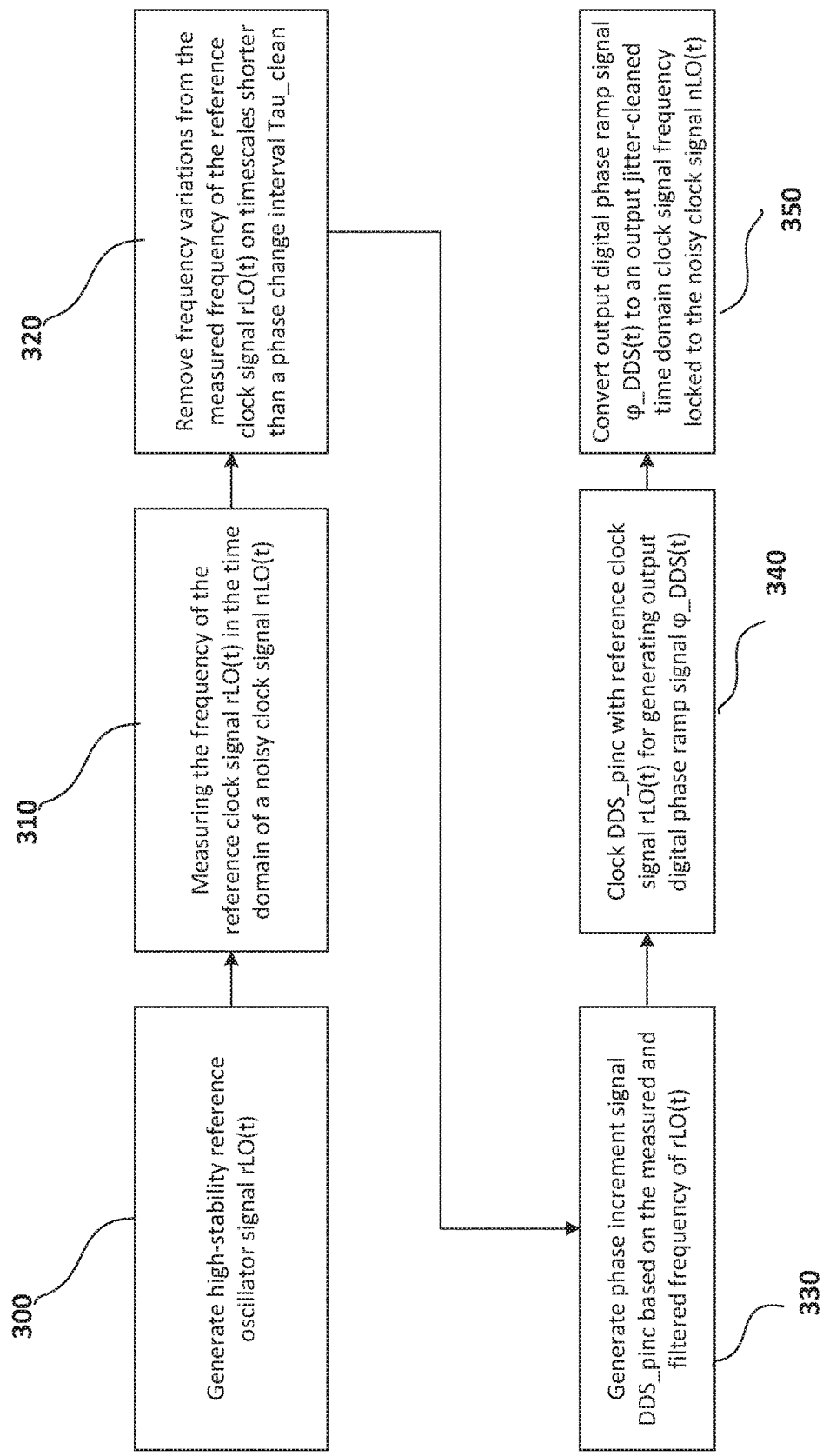
FIG. 3 is a flowchart showing an exemplary method for operation of the digital clean up oscillator of FIG. 2.

Thus, as set forth above, a digital clean-up oscillator is provided, comprising a high stability reference oscillator 250 for generating a high-stability reference clock signal; a first apparatus (i.e. DFT 260, LPFF 290 and Pinc calculator 293) for receiving the reference clock signal and a noisy clock signal to be cleaned and generating a phase increment signal based on the reference clock signal and the noisy clock signal to be cleaned; and a second apparatus (i.e. DDS 240 and digital to time domain clock converter 295) employing the phase increment signal and the reference clock signal for tracking the frequency of the noisy clock signal with phase wander removed on timescales less than the phase change interval to generate an output jitter-cleaned time As shown in FIG. 3, and discussed in greater detail below, a method is provided for operating the clean up oscillator of FIG. 2. At 300, a high-stability reference clock oscillator signal rLO(t) is generated. At 310, precision digital frequency tracker 260 receives the reference clock signal rLO(t) and noisy clock signal nLO(t) to be cleaned and in response measures the frequency of the reference clock signal rLO(t) in the time domain of the noisy clock signal nLO(t).

At 320, LPFF 290 removes any frequency variations from the measured frequency of the reference clock signal rLO(t) on timescales shorter than the phase change interval Tau_clean over which jitter in the clock signal nLO(t) is to be cleaned.

At 330, phase increment calculator 293 generates the phase increment signal DDS_pinc based on the frequency of the reference clock signal rLO(t) measured in the precision digital frequency tracker 260 and filtered by the LPFF 290.

At 340, the phase increment signal DDS_pinc is clocked with reference clock signal rLO(t) for generating output digital phase ramp signal q_DDS(t) that tracks the frequency of the clock signal (nLO) but with phase wander removed on timescales less than the phase change interval Tau_clean. Clocking of direct digital synthesizer (DDS) 240 by rLO 250 may be done by a direct connection, so as to not introduce undue phase wander of the derived digital phase ramp signal q_DDS(t) compared to rLO 250.

At 350, output digital phase ramp signal q_DDS(t) is converted by the digital to time domain clock converter 295 to an output jitter-cleaned time domain clock signal frequency locked to the noisy clock signal nLO(t).

Figure 4:
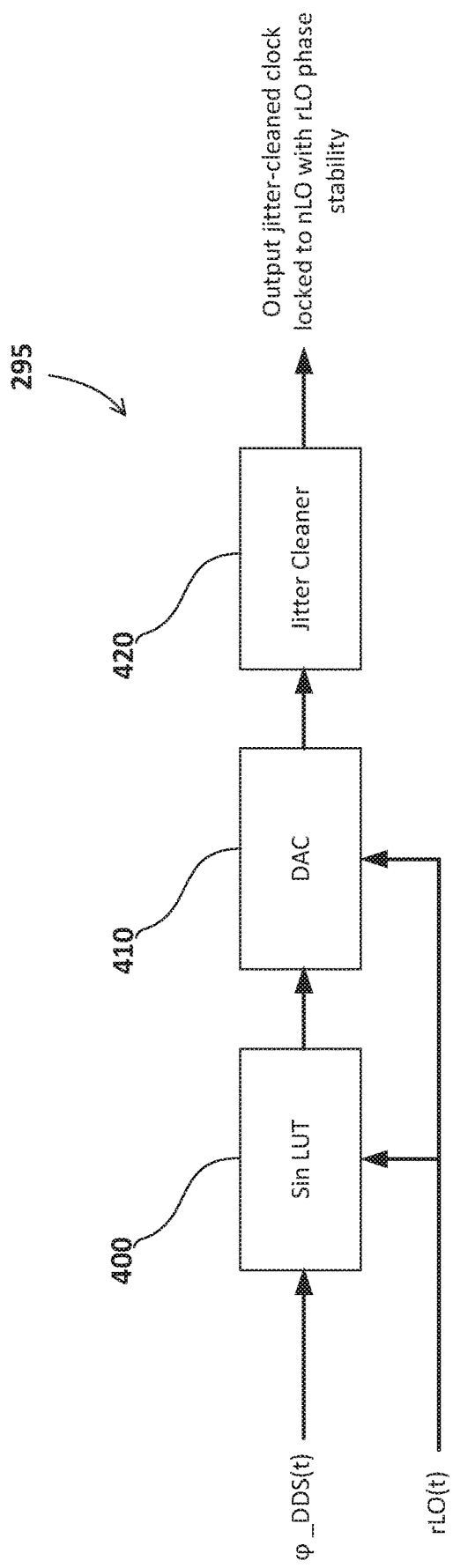
FIG. 4 is a block ddiagram of an exemplary digital to time domain clock converter for the digital clean up oscillator of FIG. 2.

Digital to time domain clock converter 295 can be implemented using a number of methods. One example of a digital to time domain clock converter 295 is shown in FIG. 4, comprising a digital phase-to-sine wave converter, look up table (LUT) 400 and digital-to-analog (DAC) converter 410 for clocking the derived digital domain clock signal q DDS(t) with rLO(t), followed by a jitter-cleaning circuit 420.

One or more of the elements of digital clean up oscillator 200 may be implemented using field-programmable gate arrays (FPGAs). In such an implementation, the DFT 260 can typically track an input frequency to achieve an RMS phase error down to 1e-7 cycles at 10 MHZ, with nLO(t) phase noise rejection limited by cut off frequency and attenuation of LPFF 290, and the phase change of rLO over Tau_clean.

In summary, as set forth herein, a digital clean-up oscillator and associated method are set forth that push jitter cleaning timescales longer than is possible with prior art oscillator steering methods that are limited by 1/f noise. The jitter cleaning timescale achievable by the digital clean-up oscillator set forth herein is limited only by the frequency stability of a reference frequency rLO(t), the absolute precise value of which is unimportant. Since all of the processing is performed in the digital domain, there are no time or temperature-dependent effects.

One contemplated application of the digital clean-up oscillator and method set forth herein is for cleaning phase-wander from the output clock of a GPS receiver (e.g. 10 MHz) to provide a much more stable clock, at any GPS receiver location. Other applications are contemplated in communications, radar, GPS timing and positioning, remote time keeping, etc.

The present invention has been described above with reference to a number of exemplary embodiments and examples. It should be appreciated that the particular embodiments shown and described herein are illustrative of the invention and its best mode and are not intended to limit in any way the scope of the invention as set forth in the claims. The features of the various embodiments may stand alone or be combined in any combination. Further, unless otherwise noted, various illustrated steps of a method can be performed sequentially or at the same time, and not necessarily be performed in the order illustrated. It will be recognized that changes and modifications may be made to the exemplary embodiments without departing from the scope of the present invention. These and other changes or modifications are intended to be included within the scope of the present invention, as expressed in the following claims.

The invention claimed is:

1. A digital clean-up oscillator, comprising:
   a reference oscillator for generating a high-stability reference clock signal;
   a precision digital frequency tracker for receiving the reference clock signal and a noisy clock signal to be cleaned, and in response measuring the frequency of the reference clock signal in the time domain of the noisy clock signal;
   a low pass filter for removing any frequency variations from the measured frequency of the reference clock signal on timescales shorter than a phase change interval over which jitter in the clock signal is to be cleaned;
   a phase increment calculator for generating a phase increment signal based on the frequency of the reference clock signal measured in the precision digital frequency tracker and filtered by the low pass filter;
   a direct digital synthesizer for clocking the phase increment signal with the reference clock signal for generating an output digital phase ramp signal that tracks the frequency of the noisy clock signal with phase wander removed on timescales less than the phase change interval; and
   a digital phase to clock converter for converting the digital phase ramp signal to an output jitter-cleaned time domain clock signal frequency locked to the noisy clock signal.

2. The digital clean-up oscillator of claim 1, wherein the precision digital frequency tracker comprises an all-digital phase/frequency locked loop for adjusting phase and frequency of an internally generated clock signal derived from the noisy clock signal to phase and frequency lock onto the reference clock signal.

3. The digital clean-up oscillator of claim 1, wherein the phase increment calculator generates the phase increment signal, pinc, for a given output frequency, f_DDS, of the digital phase ramp signal, φ_DDS(t), output from the direct digital synthesizer, based on the frequency, f_rLO(t), at which the direct digital synthesizer is clocked by the reference clock signal, and number of bits, nb_DDS of the direct digital synthesizer, as follows: $f\_DDS = DDS\_pinc(t) / 2^{nb\_DDS} \times f\_rLO(t)$.

4. The digital clean-up oscillator of claim 1, wherein the low pass filter comprises:
   a first stage FIR filter for producing filtered data points, P, every $T_{fir}$=10 msec to 1 sec, and
   a second stage for performing a 1st or higher order least-squares fit on the previous P points, to produce a closed-form expression that can be evaluated to produce the filtered reference clock signal frequency measurement.

5. The digital clean-up oscillator of claim 1, wherein the digital to time domain clock converter comprises a digital phase-to-sine wave converter, a digital-to-analog converter for clocking the digital phase ramp signal with the reference clock signal, and a jitter-cleaning circuit.

6. The digital clean-up oscillator of claim 5, wherein the digital phase-to-sine wave converter comprises a sine look up table.

7. The digital clean-up oscillator of claim 1, wherein the reference oscillator comprises an atomic clock.

8. The digital clean-up oscillator of claim 1, wherein the reference oscillator comprises an oven controlled crystal oscillator.

9. A method of cleaning jitter from a noisy clock signal, comprising:
   receiving a reference clock oscillator signal and the noisy clock signal to be cleaned;

measuring the frequency of the reference clock signal in the time domain of the noisy clock signal;

filtering any frequency variations from the measured frequency of the reference clock signal on timescales shorter than a phase change interval Tau_clean over which jitter in the noisy clock signal is to be cleaned;

generating a phase increment signal DDS_pinc based on the measured and filtered frequency of the reference clock signal;

clocking the phase increment signal DDS_pinc with the reference clock signal for generating an output digital phase ramp signal φ_DDS (t) that tracks the frequency of the noisy clock signal with phase wander removed on timescales less than the phase change interval Tau_clean; and converting the output digital phase ramp signal φ_DDS (t) to an output jitter-cleaned time domain clock signal frequency locked to the noisy clock signal.

10. The method of claim 9, wherein the phase increment, pinc, is generated for a given output frequency, f_DDS, based on a frequency, f_rLO(t), of the reference clock signal and number of bits, nb_DDS of the output digital phase ramp signal φ_DDS(t), as follows: f_DDS=DDS_pinc(t)/$2^{nb\_DDS}$×f_rLO(t).

11. The method of claim 9, wherein filtering frequency variations from the measured frequency of the reference clock signal comprises:

producing via a first stage FIR filter data points, P, every $T_{fir}$=10 msec to 1 sec, and performing a 1st or higher order least-squares fit on the previous P points, to produce a closed-form expression that can be evaluated to produce the filtered reference clock signal frequency measurement.

12. The method of claim 11, wherein attenuation of the least-squares fit is limited for a $1^{st}$ order least-squares fit to 20 log(sqrt(P)/2) for P statistically independent points with a Gaussian distribution.

13. A digital logic device comprising a plurality of logic gates configured to perform logic functions according to the method steps of claim 9.

* * * * *